(12) United States Patent
Wideman

(10) Patent No.: US 8,595,195 B2
(45) Date of Patent: Nov. 26, 2013

(54) CREATING A SELF-CONTAINED PORTABLE OUTPUT FILE

(76) Inventor: Roderick B. Wideman, Shakopee, MN (US)

(*) Notice: Subject to any disclaimer, the term of this patent is extended or adjusted under 35 U.S.C. 154(b) by 1052 days.

(21) Appl. No.: 12/246,688

(22) Filed: Oct. 7, 2008

(65) Prior Publication Data

US 2010/0088486 A1   Apr. 8, 2010

(51) Int. Cl.
*G06F 7/00*   (2006.01)

(52) U.S. Cl.
USPC ......................................................... 707/693

(58) Field of Classification Search
None
See application file for complete search history.

(56) References Cited

U.S. PATENT DOCUMENTS

| | | | |
|---|---|---|---|
| 5,990,810 A * | 11/1999 | Williams | 341/51 |
| 2002/0143792 A1* | 10/2002 | Belu | 707/200 |
| 2009/0204636 A1* | 8/2009 | Li et al. | 707/103 Y |

* cited by examiner

*Primary Examiner* — Yuk Ting Choi

(57) ABSTRACT

Various embodiments provide for creating a self-contained portable output file that includes a de-duplicated version of data. According to one embodiment, data, which includes a selected group of files, is partitioned into subblocks. A de-duplicated version of the data is created by eliminating a second subblock from the data and using a first subblock to represent the second subblock, if the second subblock is a duplicate of the first subblock. A self-contained portable output file, which includes the de-duplicated version of the data, is created.

9 Claims, 5 Drawing Sheets

CREATING A SELF-CONTAINED PORTABLE OUTPUT FILE

BACKGROUND

As more and more information is generated in this age of computer technology, the need for more storage space has increased. Further, as the amount of information increases more bandwidth is needed to communicate the information between computer systems. One way of addressing this problem is to use various techniques of reducing the amount of data that is stored or transmitted while preserving as much as possible the amount of information associated with that data. Various techniques, such as defragmentation and compression, have been developed. Defragmentation involves reorganizing files stored on a disk by storing the files in a contiguous order to reduce unusable space. Compression involves locating repeatable patterns of binary 0s and 1s in a part of a file. After that part of the file is compressed, the next part of the file is separately analyzed to locate repeatable patterns of binary 0s and 1s in that next part of the file.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Various embodiments provide for creating a self-contained portable output file that includes a de-duplicated version of data. According to one embodiment, data, which includes a selected group of files, is partitioned into subblocks. A de-duplicated version of the data is created by eliminating a second subblock from the data and using a first subblock to represent the second subblock, if the second subblock is a duplicate of the first subblock. A self-contained portable output file, which includes the de-duplicated version of the data, is created.

DESCRIPTION OF THE DRAWINGS

The accompanying drawings, which are incorporated in and form a part of this specification, illustrate embodiments of the subject matter and, together with the description, serve to explain principles discussed below.

The drawings referred to in this description should be understood as not being drawn to scale unless specifically noted.

DETAILED DESCRIPTION

Reference will now be made in detail to embodiments of the subject matter, examples of which are illustrated in the accompanying drawings. While the subject matter discussed herein will be described in conjunction with various embodiments, it will be understood that they are not intended to limit the subject matter to these embodiments. On the contrary, the presented embodiments are intended to cover alternatives, modifications and equivalents, which may be included within the spirit and scope of the various embodiments as defined by the appended claims. Furthermore, in the following detailed description, numerous specific details are set forth in order to provide a thorough understanding of embodiments of the subject matter. However, embodiments may be practiced without these specific details. In other instances, well known methods, procedures, components, and circuits have not been described in detail as not to unnecessarily obscure aspects of the described embodiments.

Notation and Nomenclature

Unless specifically stated otherwise as apparent from the following discussions, it is appreciated that throughout the detailed description, discussions utilizing terms such as "partitioning," "creating," "compressing," "identifying," "comparing," "referencing," "reassembling," "re-creating," "accessing," "viewing," "associating," "updating," "adding," "deleting," "generating," "determining," "controlling," or the like, refer to the actions and processes of a computer system, data storage system, storage system controller, microcontroller, processor, or similar electronic computing device or combination of such electronic computing devices. The computer system or similar electronic computing device manipulates and transforms data represented as physical (electronic) quantities within the computer system's/device's registers and memories into other data similarly represented as physical quantities within the computer system's/device's memories or registers or other such information storage, transmission, or display devices.

Overview of Discussion

Figure 1:
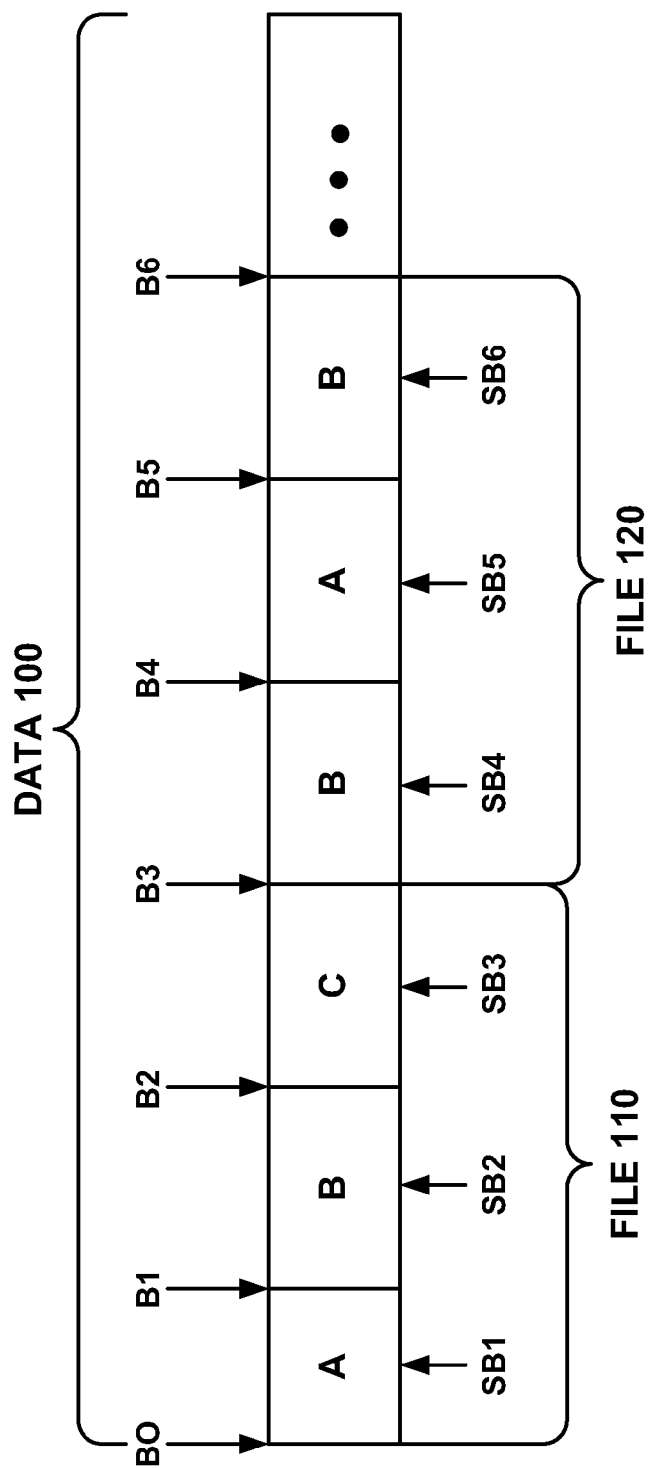
FIG. 1 depicts exemplary data that includes a group of files where the data has been partitioned into subblocks, according to one embodiment.
Figure 2:
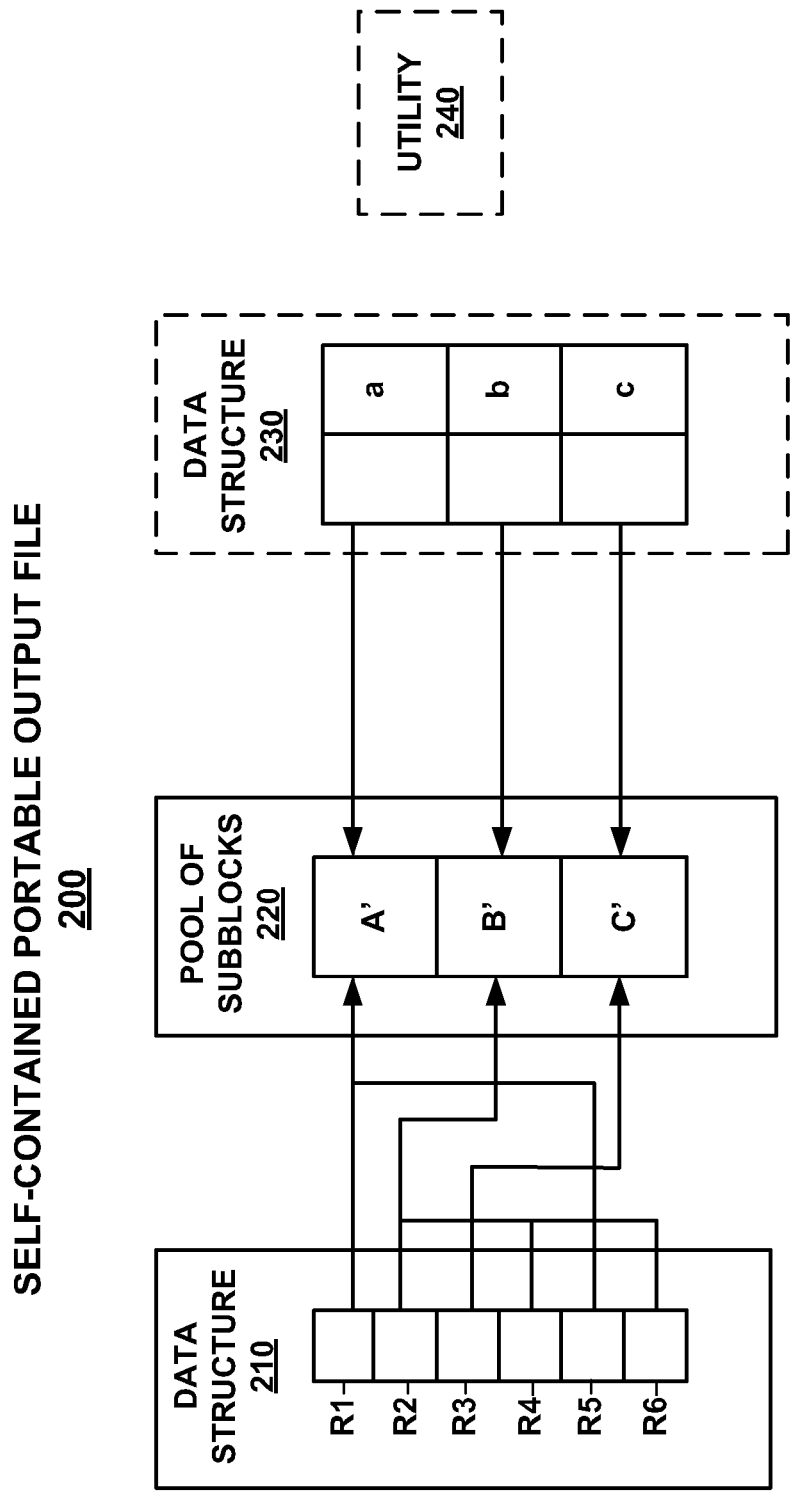
FIG. 2 is a block diagram of a self-contained portable output file that includes a de-duplicated version of data, according to one embodiment.

According to one embodiment, a self-contained portable output file, which includes a de-duplicated version of data with a group of files, is created. For example, referring to FIG. 1, data 100 is partitioned into subblocks SB1-SB6 (also commonly known as "blocklets") that include data A, B, and C. The data 100, according to one embodiment, includes a group of selected files 110, 120. The subblocks SB1-SB6 are identified and compared to determine which subblocks SB1-SB6 are duplicates. For example, as depicted in FIG. 1, subblocks SB2, SB4 and SB6 all include data B and therefore are duplicates of each other. Similarly, subblocks SB1 and SB5 both include data A and therefore are duplicates of each other. Referring to FIG. 2, the duplicate subblocks SB1, SB5, SB2, SB4, SB6 are de-duplicated, for example, by associating copies A'-C' of subblocks SB1-SB6 with a pool 220 and by using a data structure 210 to reference copies of the subblocks A'-C' in the order that the corresponding subblocks SB1-SB6 appeared in the data 100. Subblocks SB1 and SB5 both include data A. Therefore, a unique subblock copy A' represents both subblocks SB1 and SB5. Similarly, the unique subblock copy B' represents subblocks SB2, SB4, and SB6, which all include data B. Therefore, there is one copy of A' instead of 2 subblocks SB1 and SB5. Similarly there is only one copy of B' instead of 3 subblocks SB2, SB4 and SB5. Thus, according to one embodiment, duplicates are eliminated According to one embodiment, the data 100 itself is used as a part of determining how the data 100 will be partitioned into subblocks SB1-SB6, for example, using hash functions. Various embodiments exploit certain inherent properties of hash functions to determine how to partition the data 100 into subblocks SB1-SB6. For example, a hash function will return the same value when two pieces of identical data are hashed. Continuing the example, both subblocks SB1 and SB5 contain data A. Therefore, the same hash value "a" will result from hashing the data A associated with subblocks SB1 and SB5. Further, the average size of subblocks SB1-SB6 can be controlled by comparing a hash value to a predetermined constraint, as will become more evident.

According to one embodiment, a self-contained portable output file 200 (FIG. 2) that includes a de-duplicated version of the data 100 is created by associating one or more data structures 210 and 230 and a pool of subblocks 220 with the self-contained portable output file 200. The self-contained portable output file 200 can be communicated from one computer system to another computer system.

Data that Includes a Selected Group of Files

The data 100 (FIG. 1), according to one embodiment, is digital data. The data 100, according to one embodiment, can be displayed in the event that the data 100 is visual data, can be played in the event that the data 100 is audio data, or can be displayed and played in the event that the data 100 is audio-visual data.

Referring to FIG. 1, the data 100 includes a selected group of files 110, 120, according to one embodiment. For example, the group of files 110, 120 may be associated with a directory that a user has selected. In another example, the files 110, 120 may have been obtained from a database using a query. In yet another example, the group of files 110, 120 may be different versions of a document that is used for example as a part of a project where the different versions indicate the evolution of the project. In still another example, the group of files 110, 120 may be files with a certain file type. These are just a few examples of data 100 that includes a selected group of files 110, 120. Further, a specified directory, a query, a specified document with different versions, a specified file type, are examples of ways for selecting a group of files.

Subblocks

As a part of partitioning data 100 into subblocks SB1-SB6, a small fixed-length window (also referred to as a "sliding window") can be moved along the data 100 and hash values can be determined for each of the window-sized amount of data that are within the window each time the window slides, according to one embodiment. If a hash value (or other criteria, in conjunction with or without the hash value) matches a predetermined constraint, a boundary for a subblock is associated with the location of the window-sized data where the hash value was determined. As depicted in FIG. 1, boundaries B0-B6 were determined. The data 100 is then partitioned into subblocks SB1-SB6 that begin and end at the determined boundaries B0-B6. Alternate schemes for partitioning the data 100, such as creating fixed-length subblocks, can also be used.

The subblocks SB1-SB6 typically vary in length (referred to as "variable-length subblocks"). The average length of the subblocks, according to one embodiment, would be approximately a few hundred bytes to achieve a higher degree of data de-duplication. The average length may be adjusted depending on the degree of data de-duplication that is desired. A smaller average length results in a higher degree of data de-duplication than a larger average length. However, a smaller average length may incur more overhead associated with the data structures in portable output file 200.

As a part of identifying and comparing subblocks SB1-SB6 (FIG. 1), another set of hash values are determined for the subblocks SB1-SB6. For example, assume that subblocks SB1 and SB5, which include data A, result in the hash value "a," subblocks SB2, SB4 and SB6 which include data B, result in the hash value "b," and subblock SB3 which includes data C results in the hash value "c." The hash values a, b, and c can be used to identify the corresponding subblocks SB1-SB6.

The hash values for each of the subblocks SB1-SB6 are compared with each other to determine if any of the subblocks are duplicates. If two hash values are the same, then the corresponding subblocks are treated as duplicates. For example, the hash values for subblocks SB1 and SB5 would be the same and the hash values for the subblocks SB2, SB4 and SB6 would be the same. The hash function used as a part of identifying and comparing subblocks, according to one embodiment, is strong enough so that it is unlikely that hashing subblocks that are not duplicates of each other will result in the same hash value.

As already stated, the data 100 that is being partitioned may include a group of selected files 110, 120. Therefore, two subblocks SB4, SB6 that are in the same file 120 may be duplicates. However, a subblock SB2 that is in one file 110 may be a duplicate of a subblock SB4, SB5 that is in another file 120.

As a part of de-duplicating the data 100 (FIG. 1), a data structure of references can be used to reference subblock copies. For example, referring to FIGS. 1 and 2, copies of subblocks A'-C' can be associated with a pool 220. A data structure 210 can reference R1-R6 the copies of subblocks A'-C' associated with the pool 220 in the order that the corresponding subblocks SB1-SB6 appeared in the data 100. Duplicate subblocks of data can be eliminated since the data structure 210, according to one embodiment, would point to a unique copy of a subblock for each occurrence of the subblock in the data 100. Each subblock copy A', B', C' is unique since none of the copies A', B', C' associated with the pool of subblocks 220 are duplicates of each other. For example, A' is not a duplicate of either B' or C' and so on. References R1 and R5 in data structure 210 point to the subblock copy A' which corresponds to data A associated with subblocks SB1 and SB5. Similarly, references R2, R4, and R6 in data structure 210 point to the subblock copy B' which corresponds to data B associated with subblocks SB2, SB4, and SB6.

Although FIG. 2 depicts the pool 220 of subblock copies A'-C' in a particular order, the subblock copies A'-C' are not required to be stored in any particular order in the pool 220. The term "subblock" can be used to refer to portions SB1-SB6 of data 100 (FIG. 1) in its original format or to copies A'-C' (FIG. 2) of those portions SB1-SB6 of data 100.

Hash Functions

According to one embodiment, hash functions are used as a part of determining boundaries and as a part of generating subblock identities. The subblock identities can be compared to determine if the respective subblocks are duplicates of each other.

Hash functions come in different classes of strengths and widths. A hash function will return the same value each time that the same data is hashed regardless of how weak or strong the hash function is. However, a strong hash function also ensures with a high probability that when the hash values for two pieces of data are different, then the two pieces of data are also different.

The following is a description of several classes of hash functions. Narrow hash functions are the weakest class of hash functions and are narrow enough that they can be used to search values in a relatively reasonable amount of time. Examples of narrow hash functions include CRC-16, CRC-32, Fletcher checksum and IP checksum. Wide hash functions are typically 128 bits wide and therefore the probability of two randomly chosen subblocks resulting in the same hash value would be very small. Examples of wide hash functions include 128-bit CRC algorithms.

Weak one-way hash functions and strong one-way hash functions result in a hash value that is wide enough to ensure that a first subblock and a second subblock that result in the same hash value are duplicates and also to ensure that a third subblock that results in a different hash value is not a duplicate of the first and second subblock. In other words, a weak one-way hash function and a strong one-way hash function can uniquely identify portions of data associated with subblocks by identifying that data A associated with subblock SB1 is the same as data A associated with subblock SB5 but is not the same as data B associated with subblock SB2. An example of a weak one-way hash function is 64-bit DES hash. Examples of strong one-way hash functions include MD4, MD5 and SHA-1.

As already stated, a sliding window can be used as a part of partitioning data 100 into subblocks SB1-SB6. For the purposes of illustration, assume that the sliding window is three characters long. The same hash value will be generated each time the sliding window encounters, for example, the characters "gec." As will become more evident, the fact that the same hash value is generated each time the sliding window encounters the same data is used as a part of determining boundaries. According to one embodiment, the weakest class of hash functions can be used as a part of determining boundaries since the process of determining boundaries can tolerate two different window-sized amount of data, which are not duplicates, result in the same hash value.

Although many of the examples described herein refer to boundaries being between characters, the boundaries may be determined in between bits, bytes, characters, etc. . . . . . Any unit of measuring digital data can be used as a part of determining the subblocks' boundaries.

According to another embodiment, strong classes of hash functions are used as a part of generating subblock identities that are compared to each other. For example, a strong one-way hash function may be used for generating subblock identities as depicted in the second column of data structure 230 (FIG. 2).

Although many of the examples described herein refer to determining whether subblocks are duplicates by comparing corresponding hash values, other methods can be used for determining whether subblocks are duplicates. For example, data associated with subblocks or subblock copies can be compared to each other. More specifically, subblock SB4's data B could be compared with subblock SB2's data B, or subblock SB4's data B could be compared with data B' in pool 220.

Predetermined Constraint

As already stated, the location of boundaries B1-B6 (FIG. 1) for partitioning subblocks SB1-SB6 (FIG. 1) are determined based on hash values of the data associated with the sliding window matching a predetermined constraint, according to one embodiment. A predetermined constraint, according to one embodiment, is a specified constant value. An example of a predetermined constraint is that the least significant N bits of the hash of the sliding window's data equal zero. A predetermined constraint can be used to control the average subblock size and thus the number of subblocks for data 100 (FIG. 1) can be controlled. According to one embodiment, the value of the predetermined constraint is selected to result in an average subblock size of a few hundred bytes to achieve a higher degree of data de-duplication. Higher degrees of data de-duplication are achieved with smaller average subblock sizes.

Further, by comparing the hash values to a predetermined constraint, a subsequent boundary is determined based on a second window-sized amount of data meeting the same predetermined constraint that a first window sized amount of data associated with a previous boundary has already met. Continuing the example of the sliding window encountering characters "gec" more than once, the hash value will be the same for at least each occurrence of the characters "gec." Also assume that a boundary was determined at the first occurrence of "gec" because the hash value of "gec" matches a predetermined constraint. Therefore, a boundary will be determined at least at each occurrence of the characters "gec," according to one embodiment. If a weak hash function is used for determining the hash values for each window-sized data within the sliding window, then other character combinations associated with window-sized data may meet the same predetermined constraint that "gec" met. Therefore, according to one embodiment, a boundary is determined at least at each occurrence of "gec."

Data Structures

This section shall refer to FIGS. 1 and 2. As a part of identifying and comparing subblocks SB1-SB6, a first data structure 210 is used to store references to subblock copies A'-C' in the order that the corresponding subblocks SB1-SB6 appeared in the data 100's original format, according to one embodiment. The references R1-R6 correspond to the respective subblocks SB1-SB6 so that R1 is a reference to a subblock copy A' of subblock SB1, R2 is a reference to a subblock copy B' of subblock SB2 and so on. The first data structure 210 shall be referred to as a "subblock to original format map."

As a part of identifying and comparing subblocks SB1-SB6, a second data structure 230 may associate the hash values a-c, which were determined for the subblocks SB1-SB6, with copies A'-C' of the subblocks SB1-SB6 that correspond to the hash values a-c. For example, if a hash value "a" was determined for a subblock SB1 (data A) and a hash value "b" was determined for a subblock SB2 (data B), then the data structure 230, according to one embodiment, associates the hash value "a" with the copy A' of the subblock SB1 and the hash value "b" with the copy B' of the subblock SB2 and so on. The second data structure 230 shall be referred to as a "hash values to subblock map."

In the event that the data 100 (FIG. 1) is too large to be processed by an apparatus 300 (FIG. 3), the data 100 may be partitioned into pieces in order to input the data 100 into the apparatus 300. A third data structure may be used to keep track of these pieces and the order that the pieces occurred in the data 100's original format. The apparatus 300 may then process the pieces to determine the subblocks SB1-SB6 (FIG. 1), as will become more evident.

Although many of various data structures 210, 230 (FIG. 2) are depicted or described as arrays, other types of structures such as linked lists, hash tables, sorted trees, ordered lists or arrays, unordered lists or arrays, etc. . . . , may be used as a part of implementing the data structures. A linked list may be sorted. Examples of a sorted tree include, but are not limited to, a binary tree, N-ary tree, and AVL tree. Further, a data structure described herein may be implemented as more than one data structure, or two or more data structures described herein may be combined.

Many of the examples described herein use the term "reference" for identifying a subblock or for storing a location of a subblock. The term "reference" shall refer to any type of identifier that can be used for identifying a subblock such as a pointer, a reference, an identifying number, a location of a subblock in memory, a relative subblock number, or a range.

Although FIG. 2 depicts references in a certain order, various embodiments do not require the references to be in any particular order.

Self-Contained Portable Output File

Referring to FIGS. 1 and 2, according to one embodiment, a self-contained portable output file 200, which includes the de-duplicated version of the data 100, is created. The self-contained portable output file 200 includes a de-duplicated version of the data 100 in the form of one or more data structures 210, 230, a pool of subblocks 220 and utility 240, according to one embodiment. Data structure 230 and utility 240 are optional.

The output file 200 is "self-contained," according to one embodiment, because the output file 200 includes enough information, such as data structure 210 and pool of subblocks 220, for viewing the de-duplicated version of the data 100 in an original format of the data 100. For example, a utility, such as utility 240, that is a part of output file 200 or separate from output file 200, can either access the pool of subblocks 220 in a manner that appears as if the data 100 was re-created without actually re-creating the data 100 or recreate the data 100 using the pool of subblocks 220 and the data structure 210, among other things The output file 200 is "portable," according to one embodiment, because it 200 can be used by two or more computer systems. The computer systems are not required to have the same platform or be the same type.

The output file 200 (FIG. 2) is populated with the namespace of the files 110, 120 (FIG. 1) associated with the selected group of files 110, 120, according to one embodiment. For example, the file 110, 120s' names, the file 110, 120s' attributes and optionally the pathnames that were used for the files 110, 120 associated with the data 100 in its original format, may be associated with the output file 200. A self-contained portable output file 200 may have a unique file extension, such as "dzp."

Figure 3:
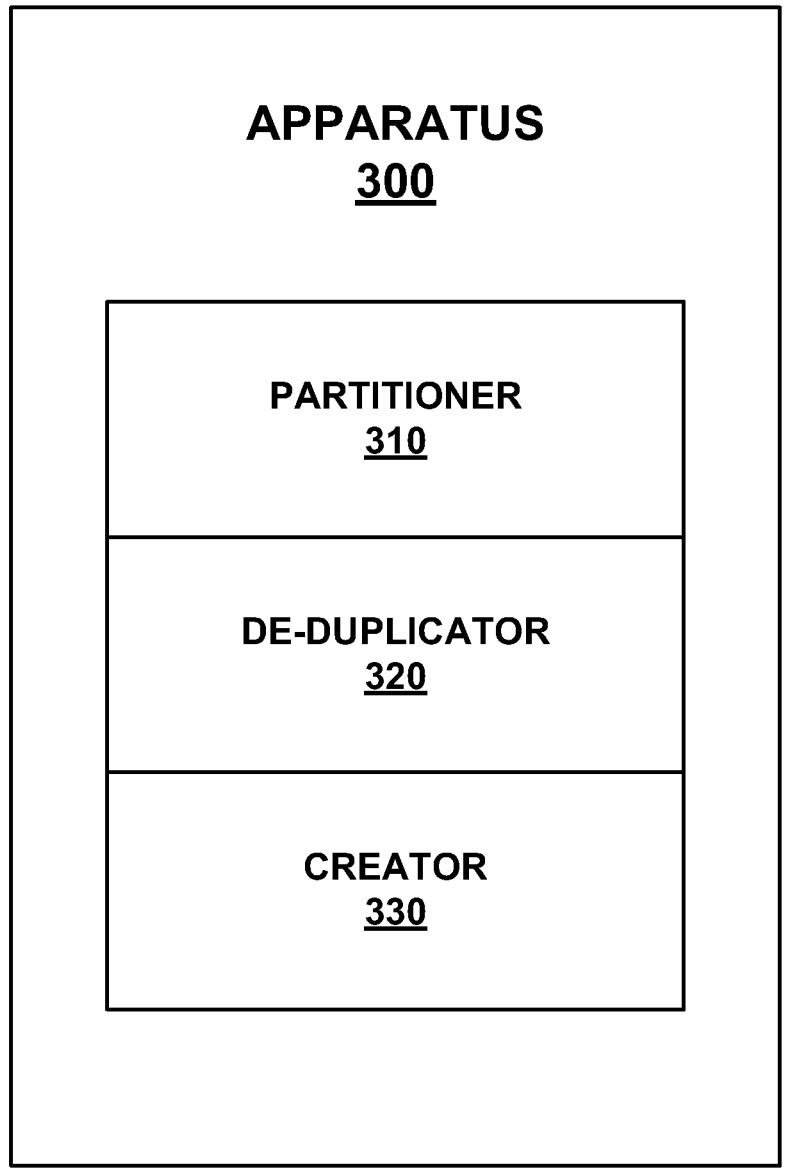
FIG. 3 is a block diagram of an apparatus for creating a self-contained portable output file that includes a de-duplicated version of data, according to one embodiment.

The self-contained portable output file 200 (FIG. 2) depicts one data structure 210 that can be used for mapping subblock copies to the original format of the data 100 (FIG. 1). However, more than one data structure may be used as a part of mapping subblock copies to the data 100's original format. For example, if the data 100 is large, pieces of the data 100 may be input to the apparatus 300 (FIG. 3). In this case, there may be a data structure that maps the order that the pieces appeared in the original format, referred to herein as "pieces to original format map." Then there may be a second level of data structures, which are similar to data structure 210 (FIG. 2) where each of these data structures map subblock copies to their corresponding subblocks in the order that the subblocks appeared in their respective pieces. The "pieces to original format map" may also map the pieces to the respective second level of data structures.

According to another embodiment, there is another data structure that maps subblock copies A'-C' (FIG. 2) to the files 110, 120 (FIG. 1) they were associated with in the original format of the data 100 (FIG. 1). For example, subblock copies A'-C' would be mapped to file 110 and subblock copies A' and B' would be mapped to file 120.

Additional files can be added to a self-contained portable output file 200 (FIG. 2). For example, copies of the new unique subblocks for an additional file can be stored in the pool 220 (FIG. 2) and the data structures 210, 230 (FIG. 2) can be updated accordingly. More specifically, hash values for subblocks associated with the added file can be compared to the hash values associated with the data structure 230 to determine if copies of those subblocks have already been associated with the pool 220. For example, assume that the new file includes a subblock with data D that does not occur anywhere in data 100. A unique copy D' could be added to the pool 220, a reference R7 could be added to the data structure 210 and a fourth row could be added to the data structure 230 that references subblock copy D' and has the hash value "d."

Files may also be deleted from a self-contained portable output file 200. For example, a copy of a subblock associated with the deleted file is deleted from the pool 220 when the only occurrences of a subblock are associated with the deleted file. For example, assume that file 110 is deleted from data 100 (FIG. 1). Data C only occurs in file 110. In this case, subblock copy C' would be deleted from the pool 220, reference R3 would be deleted from data structure 210 and the third row would be deleted from data structure 230.

If a deleted file includes portions of data that are also associated with other files, then the reference to the corresponding subblock's copy is deleted from the data structure 210 but pool 220 and data structure 230 are not modified. For example, assume that file 120 is deleted which includes data A and B which also occur in file 110. In this case, references R4, R5, and R6 would be deleted from data structure 210 but the pool 220 and the data structure 230 would not be modified since data A and B are also associated with file 110.

Data structure 230 may be included in the output file 200 for the purpose of making it easier to update the output file 200 when a file is added to or deleted from the group of files after the output file 200 has already been created. However, data structure 230 is not required for the self-contained portable output file 200 to add or delete files since the data structure 230 could be generated when and if files are added or deleted.

Compression and Encryption

Referring to FIG. 2, the self-contained portable output file 200 may be compressed. For example, each subblock copy A'-C' associated with the pool 220 may be compressed. The portable output file 200 may be encrypted. For example, the data structures 210, 230 and the pool of subblocks 220 may be encrypted together or each may be encrypted individually. Further, a subset of the subblock copies A'-C' may be compressed or encrypted.

According to one embodiment, the data 100 (FIG. 1) is de-duplicated prior to compression being performed. Examples of types of compression that may be used include, but are not limited to, Lempel Ziv (LZ), Lempel Ziv Welch (LZW), Huffman encoding, and run length encoding.

An Apparatus for Creating a Self-Contained Portable Output File that Includes a De-Duplicated Version of Data FIG. 3 is a block diagram of an apparatus 300 for creating a self-contained portable output file 200 that includes a de-duplicated version of data 100, according to one embodiment. The blocks that represent features in FIG. 3 can be arranged differently than as illustrated, and can implement additional or fewer features than what are described herein. Further, the features represented by the blocks in FIG. 3 can be combined in various ways. The apparatus 300 can be implemented using software, hardware, firmware, or a combination thereof.

The description of apparatus 300 shall refer to FIGS. 1-3. The apparatus 300 as depicted in FIG. 3 includes a data-with-group-of-selected-files-partitioner (referred to herein as a "partitioner"), a data-with-group-of-selected-files-de-duplicator 320 (referred to herein as a "de-duplicator"), and a self-contained-portable-output-file-with-de-duplicated-version-of-data-creator 330 (referred to herein as a "creator"). The partitioner 310 is configured for partitioning data 100, which includes a selected group of files 110, 120, into subblocks SB1-SB6. The de-duplicator 320 is configured for creating a de-duplicated version of the data 100 by eliminating a second subblock SB4 from the data 100 and using a first subblock SB2 to represent the second subblock SB4, if the second subblock SB4 is a duplicate of the first subblock SB2. The self-contained-portable-output-file-with-de-duplicated-version-of-data-creator 330 is configured for creating a self-contained portable output file 200 that includes the de-duplicated version 210, 220 of the data 100. The partitioner 310, the de-duplicator 320, and the creator 330 are communicatively coupled. Therefore, according to one embodiment, the self-contained portable output file 200 is "output" of the apparatus 300. The apparatus 300 shall be described in more detail in the context of flowchart 400 (FIG. 4) described below.

Figure 4:
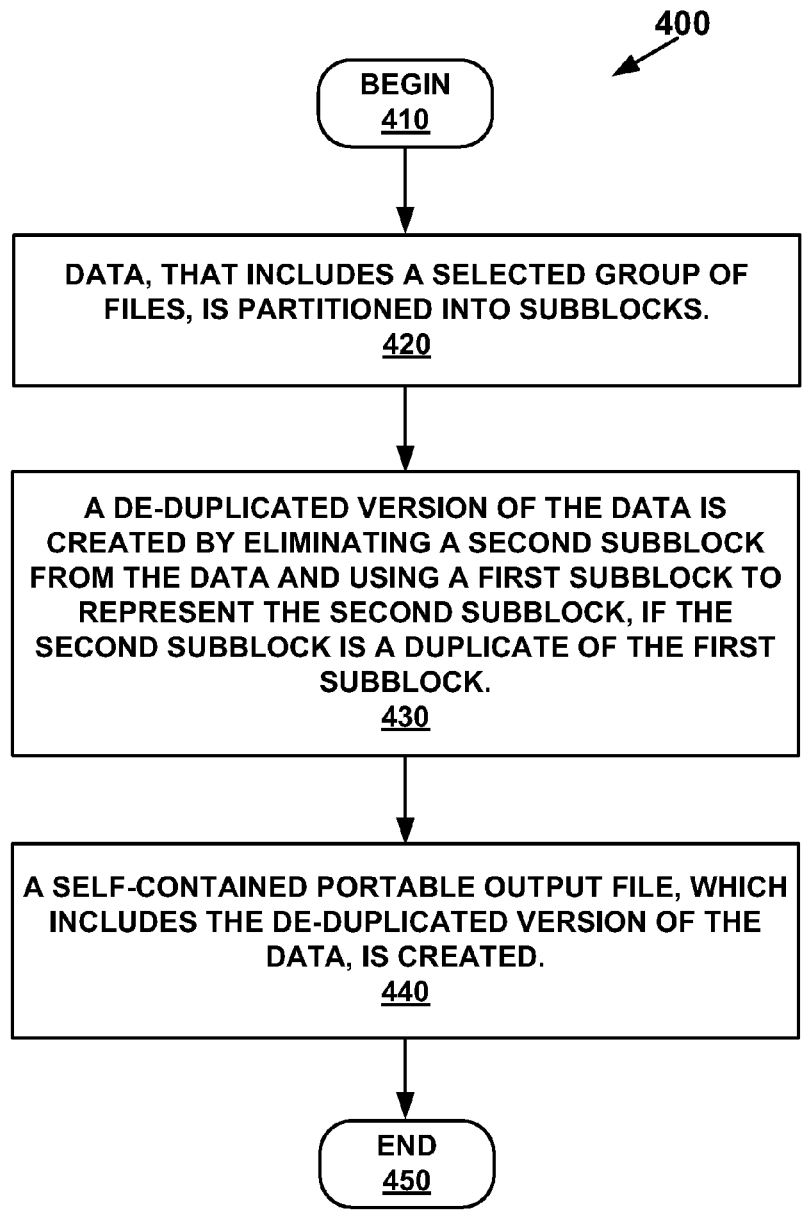
FIG. 4 depicts a flowchart for a method of creating a self-contained portable output file that includes a de-duplicated version of data, according to one embodiment.

A Method of Creating a Self-Contained Portable Output File that Includes a De-Duplicated Version of Data FIG. 4 depicts a flowchart 400 for a method of creating a self-contained portable output file 200 that includes a de-duplicated version of data 100, according to one embodiment. Although specific steps are disclosed in flowchart 400, such steps are exemplary. That is, embodiments of the present invention are well suited to performing various other steps or variations of the steps recited in flowchart 400. It is appreciated that the steps in flowchart 400 may be performed in an order different than presented, and that not all of the steps in flowchart 400 may be performed.

All of, or a portion of, the embodiments described by flowchart 400 can be implemented using computer-usable media and computer-executable instructions which reside, for example, in computer-usable media of a computer system or like device. The computer-usable media can be any kind of memory that instructions can be stored on. Examples of the computer-usable media include but are not limited to a disk, a compact disk (CD), a digital video device (DVD), read only memory (ROM), flash, and so on. As described above, certain processes and steps of embodiments of the present invention are realized, in one embodiment, as a series of instructions (e.g., software program) that reside within computer readable memory of a computer system and are executed by the processor of the computer system. When executed, the instructions cause the computer system to implement the functionality of the present invention as described below.

The following discussion of flowchart 400 shall refer to FIGS. 1-3. At 410, the method begins.

At 420, data, that includes a selected group of files, is partitioned into subblocks, according to one embodiment. For example, the partitioner 310 can move a small fixed-length window (also referred to as a "sliding window") along the data 100 and determine hash values for the plurality of the window-sized amount of data that are within the window as it slides, according to one embodiment. According to one embodiment, a weak class of hash functions is used as a part of determining boundaries. For the purposes of illustration, assume that the window is 3 characters (or bytes) in length. If the hash value matches a predetermined constraint, a boundary for a subblock is associated with the location of the fixed-length window where the hash function was performed. Comparing the hash value to a predetermined constraint enables controlling the average size of the subblocks.

Further, by comparing a hash value for a window-sized amount of data, associated with the sliding window, with the predetermined constraint, subsequent boundaries will be determined when the predetermined constraint is met again. Continuing the example of the sliding window encountering characters "gec" more than once, the hash value will be the same for each occurrence of the characters "gec." Also assume that a boundary was determined at the first occurrence of "gec" because the hash value of "gec" matches a predetermined constraint. Therefore, as described herein, a boundary will be determined at least at each occurrence of the characters "gec," according to one embodiment. A boundary may be determined for other character combinations that meet the same predetermined constraint that "gec" met.

As depicted in FIG. 1, boundaries B0-B6 were determined. The data 100 is then partitioned into subblocks SB1-SB6 that begin and end at the determined boundaries B0-B6.

At 430, a de-duplicated version of the data is created by eliminating a second subblock from the data and using a first subblock to represent the second subblock, if the second subblock is a duplicate of the first subblock, according to one embodiment. For example, the de-duplicator 320 can identify and compare subblocks. More specifically, the de-duplicator 320 can determine hash values, using a strong hash function, for the subblocks SB1-SB6 (FIG. 1). The hash function used as a part of identifying and comparing subblocks SB1-SB6, according to one embodiment, is strong enough so that it is unlikely that hashing subblocks SB1-SB6, which are not duplicates, will result in the same hash value. For example, the hash function, according to one embodiment, is strong enough so that data A, data B and data C will not result in the same hash value. Continuing the example, assume that subblocks SB1 and SB5 which include data A result in the hash value "a," subblocks SB2, SB4 and SB6 which include data B result in the hash value "b," and subblock SB3 which includes data C results in the hash value "c." The hash values are compared with each other to determine if any of the subblocks are duplicates. If two hash values are the same, then the corresponding subblocks are treated as duplicates. For example, the hash values for subblocks SB1 and SB5 would be the same and the hash values for the subblocks SB2, SB4 and SB6 would be the same.

The de-duplicator 320 can create a data structure of references that point to subblock copies. For example, referring to FIGS. 1 and 2, the copies of subblocks A'-C' can be associated with a pool 220. A data structure 210 can reference R1-R6 copies of subblocks A'-C' associated with the pool 220 in the order that the subblocks SB1-SB6 appeared in the data 100.

Duplicate subblocks of data can be eliminated since the data structure 210, according to one embodiment, would point to a unique copy of a subblock for each occurrence of a subblock in the data 100. For example, references R1 and R5 in data structure 210 point to the subblock copy A' which corresponds to data A associated with subblocks SB1 and SB5. Similarly, references R2, R4, and R6 in data structure 210 point to the subblock copy B' which corresponds to data B associated with subblocks SB2, SB4, and SB6.

The de-duplicator 320, according to one embodiment, also creates a data structure 230 that maps hash values a-c, which were determined for the subblocks SB1-SB6, with copies A'-C' of the subblocks SB1-SB6 that correspond to the hash values a-c. For example, as unique copies of subblocks are associated with the pool 220, the de-duplicator 320 can enter a reference and a subblock identifier into the data structure 230. More specifically, when the subblock copy A' is stored in the pool 220, a reference to subblock copy A' and the subblock identifier "a" can be entered into the first row of the data structure 230. According to one embodiment, the subblock identifier is a hash value that resulted from hashing a subblock, such as subblock SB1, for example, with a strong one-way hash function. Subblocks SB1 and SB5 would result in the same subblock identifier. Similar processing can be performed for the second and third rows depicted in data structure 230.

A de-duplicated version of the data is created by eliminating a second subblock from the data and using a first subblock to represent the second subblock, if the second subblock is a duplicate of the first subblock, according to one embodiment. Continuing the example, when processing begins, the data structure 230 and the pool 220 will be empty. A copy of subblock SB1, with data A', is added to the pool 220 and a row that includes the hash value "a" and a reference to data A' is added to the first row of the data structure 230. When subblock SB2 is processed, the data structure 230 will not include a hash value that is equal to subblock SB2's hash value "b." Therefore, processing can determine that this is the first time that the data B associated with subblock SB2 has been processed. The pool 220 and the data structure 230 can be updated in a similar manner for subblocks SB2 and SB3 as they were for subblock SB1.

As this point, the pool 220 includes subblock copies A', B', and C' and data structure 230 includes the three rows depicted in FIG. 2. Subblocks SB2 and SB4 are duplicates because they both include data B, which hashes to hash value b. A copy of subblock SB2, which includes data B', is already associated with the pool 220 and the second row, which includes a reference to data B' in the pool 220 and the hash value "b," is already associated with data structure 230 when subblock SB4 is processed. Processing can determine that subblock SB4 is a duplicate of subblock SB2 either by comparing the data B associated with subblock SB4 to the data B' associated with the pool 220 or by comparing the hash value b determined based on subblock SB4's data B to the hash value b in the second row of data structure 230, among other things. Therefore, subblock SB2 is an example of a first subblock and subblock SB4 is an example of a second subblock. Subblocks SB2 and SB4 are duplicates of each other. The second subblock SB4 is eliminated from the data 100 by using the first subblock SB2 to represent the second subblock SB4, for example by using the pooled data B'.

At 440, a self-contained portable output file, which includes the de-duplicated version of the data, is created, according to one embodiment. For example, the creator 330 can create a self-contained portable output file 200 that includes one or more data structures 210, 230, a pool of subblocks 220, and an optional utility 240. The output file 200 may or may not contain the utility.

At 450, the method ends.

According to one embodiment, at least a portion of the output file 200 (FIG. 2), such as the subblock copies A'-C', can be compressed. Further, at least a portion of the self-contained portable output file 200 can be encrypted.

The self-contained portable output file 200 can be communicated from one computer system to another computer system. Examples of communication include but are not limited to transmitting the output file 200 over a network and storing the output file 200 on a storage device and using the storage device to communicate the output file 200 from the first computer system to the second computer system. The utility 240 associated with the output file 200 can be used to either access the de-duplicated version of data as if it were in the data 100's original format or re-crate the data 100 using the pool of subblocks 220 and the data structure 210.

Exemplary Computer System

Figure 5:
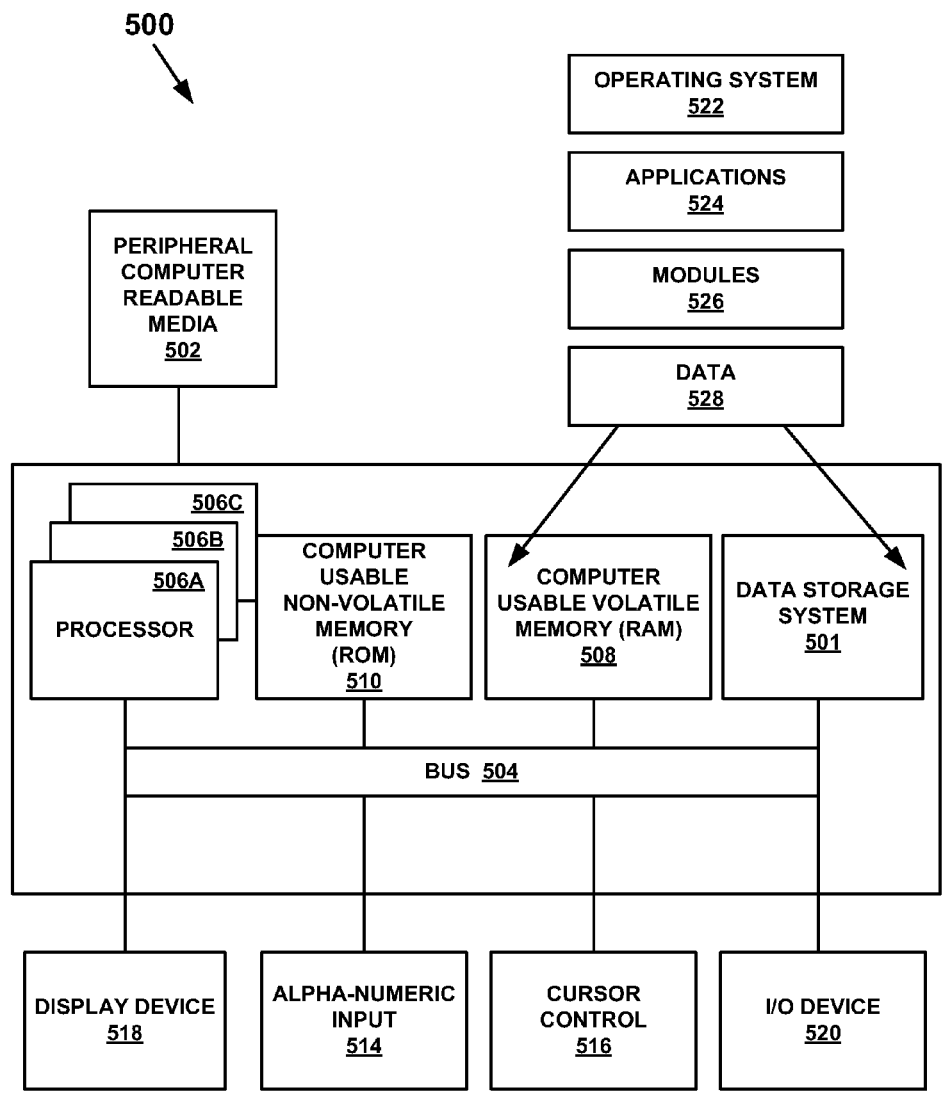
FIG. 5 is a block diagram of an exemplary computer system, according to one embodiment.

FIG. 5 is a block diagram of an example computer system 500, according to an embodiment. According to one embodiment, a computer system 500 includes an apparatus 300 (FIG. 3). In another embodiment, a utility 240 (FIG. 2) can execute on a computer system 500. In another embodiment, an output file 200 (FIG. 2) can be communicated between two computer systems 500. With reference now to FIG. 5, portions of the subject matter comprise or can comprise computer-readable and computer-executable instructions that reside, for example, in computer-usable media of a computer system. That is, FIG. 5 illustrates one example of a type of computer that can be used to implement embodiments of the subject matter which are discussed herein. FIG. 5 illustrates an example computer system 500 used in accordance with embodiments of the subject matter. It is appreciated that computer system 500 of FIG. 5 is an example, and that the subject matter can operate on or within a number of different computer systems including general purpose networked computer systems, embedded computer systems, optical computer systems, virtual computer systems, database systems, server devices, client devices, various intermediate devices/nodes, stand alone computer systems, and the like. As shown in FIG. 5, computer system 500 of FIG. 5 is well adapted to having peripheral computer readable media 502 such as, for example, a floppy disk, a compact disc, and the like coupled thereto.

Computer system 500 of FIG. 5 includes an address/data bus 504 for communicating information, and a processor 506A coupled to bus 504 for processing information and instructions. As depicted in FIG. 5, computer system 500 is also well suited to a multi-processor environment in which a plurality of processors 506A, 506B, and 506C are present. Conversely, computer system 500 is also well suited to having a single processor such as, for example, processor 506A. Processors 506A, 506B, and 506C may be any of various types of microprocessors.

Computer system 500 also includes data storage features such as a computer usable volatile memory 508, e.g. random access memory (RAM), coupled to bus 504 for storing information and instructions for processors 506A, 506B, and 506C. Computer system 500 also includes computer usable non-volatile memory 510, e.g. read only memory (ROM), coupled to bus 504 for storing static information and instructions for processors 506A, 506B, and 506C. Also present in computer system 500 is a data storage system 501 (e.g., a plurality of magnetic or optical disks and drives and/or solid state storage units) coupled to bus 504 for storing information and instructions.

Computer system 500 also includes, in one embodiment, an optional alphanumeric input device 514 including alphanumeric and function keys coupled to bus 504 for communicating information and command selections to processor 506A or processors 506A, 506B, and 506C. Computer System 500 also includes, in one embodiment, an optional cursor control device 516 coupled to bus 504 for communicating user input information and command selections to processor 506A or processors 506A, 506B, and 506C. Computer system 500 of the present embodiment also includes, in one embodiment, an optional display device 518 coupled to bus 504 for displaying information.

Referring still to FIG. 5, optional display device 518 may be a liquid crystal device, cathode ray tube, plasma display device or other display device suitable for creating, presenting, or displaying graphic images and/or symbols or alphanumeric characters recognizable to a user. Optional cursor control device 516 allows the computer user to dynamically signal the movement of a visible symbol (cursor) on a display screen of display device 518. Many implementations of cursor control device 516 are known in the art including a trackball, mouse, touch pad, joystick, directional and input keys on a multimedia remote control, or special keys on alpha-numeric input device 514 capable of signaling movement of a given direction or manner of displacement. Alternatively, it will be appreciated that a cursor can be directed and/or activated via input from alpha-numeric input device 514 using special keys and key sequence commands. Computer system 500 is also well suited to having a cursor directed by other means such as, for example, voice commands.

Computer system 500 also includes, in one embodiment, an I/O device 520 for coupling computer system 500 with external entities. For example, in one embodiment, I/O device 520 is a modem for enabling wired or wireless communications between computer system 500 and an external network such as, but not limited to, the Internet.

Referring still to FIG. 5, various other components are depicted for computer system 500 and may be included in various embodiments. Specifically, when present, an operating system 522, applications 524, modules 526, and data 528 are shown as typically residing in one or some combination of computer usable volatile memory 508, e.g. random access memory (RAM), and data storage system 501. In some embodiments, the subject matter discussed herein is stored, for example, as an application 524 or module 526 in memory locations within RAM 508, computer readable media within data storage system 501, and/or peripheral computer readable media 502.

CONCLUSION

Prior art zip files use compression but the compression used only applies to localized portions of a single file. For example, assume that a zip file contains a file with portions A, B, and C. Compression for prior art zip files is applied separately to each portion A, B, and C at a time. Therefore, if portion A and portion B include subsets of data that are duplicates, compression will not detect those duplicates. Further, the portions are rather small in size, typically approximately 1000 bytes.

To date there has not been a way to save space that locates duplicate portions of data that may occur in any file of a group of files that a user may want to transmit from one computer system to another computer system as a part of a self-contained portable output file.

To date, the prior art has taught that it is not worthwhile to perform de-duplication on relatively smaller amounts of data as would be encountered with de-duplicating data that includes a group of selected files that is associated with a portable output file.

Example embodiments of the subject matter are thus described. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

Various embodiments have been described in various combinations. However, any two or more embodiments may be combined. Further, any embodiment may be used separately from any other embodiments.

What is claimed is:

1. A method of creating a self-contained portable output file, comprising:
    accessing a selected group of files associated with a first computer, where the selected group of files are formatted in an original format;
    accessing a pool of unique subblocks associated with the selected group of files, where the pool of unique subblocks is the product of a data de-duplication process and where the pool of unique subblocks contains sufficient data to recreate the selected group of files in the original format;
    accessing a first data structure associated with the pool of unique subblock, where the first data structure stores a mapping that relates a subblock in the pool of unique subblocks to a member of the selected group of files;
    accessing a second data structure associated with the pool of unique sub-blocks, where the second data structure stores a mapping that relates a hash value to a subblock in the pool of unique subblocks;
    instantiating an output file;
    adding file identification data to the output file, where the file identification data identifies one or more members of the selected group of files;
    adding one or more subblocks to the output file, where the one or more subblocks are copied from the pool of unique subblocks and where the one or more subblocks are sufficient to recreate the one or more members of the selected group of files identified by the file identification data;
    adding a first derived data structure to the output file, where the first derived data structure includes one or more members of the first data structure; and
    adding a second derived data structure to the output file, where the second derived data structure includes one or more members of the second data structure;
    where the output file contains sufficient data related to the files identified by the file identification data to facilitate a second computer different from the computer to recreate the files identified by the file identification data without accessing the selected group of files in their original format when the computer communicates the output file to the second computer.

2. The method of claim 1, where the file identification data includes a namespace for the selected group of files.

3. The method of claim 1, comprising adding a utility to the output file, where the utility facilitates viewing the group of selected files without accessing the selected group of files in their original format.

4. The method of claim 1, comprising adding a utility to the output file, where the utility facilitates the output file self-extracting the file identification data, one or more subblocks, the first derived data structure, and the second derived data structure.

5. The method of claim 1, comprising selectively updating the output file when a file is added to the selected group of files and when a file is removed from the selected group of files.

6. The method of claim 5, where selectively updating the output file includes adding a subblock to the output file when a file is added to the selected group of files.

7. The method of claim 5, where selectively updating the output file includes removing a subblock from the output file when a file is removed from the selected group of files.

8. The method of claim 1, comprising controlling a first computer that performs the method to communicate the output file to a second computer that did not perform the method data.

9. A non-transitory computer-readable medium storing computer executable instructions that when executed by a computer cause the computer to perform a method, the method comprising:

accessing a selected group of files available to the computer;

accessing a pool of unique subblocks associated with the selected group of files, where the pool of unique subblocks is the product of a data de-duplication performed by the computer;

accessing a first data structure associated with the pool of unique subblocks, where the first data structure stores a mapping that relates a subblock in the pool of unique subblocks to a member of the selected group of files;

accessing a second data structure associated with the pool of unique sub-blocks, where the second data structure stores a mapping that relates a hash value to a subblock in the pool of unique subblocks, where the hash value was produced as part of the data de-duplication performed by the computer;

creating an empty output file;

adding file identification data to the output file, where the file identification data identifies one or more members of the selected group of files;

adding one or more subblocks to the output file, where the one or more subblocks are copied from the pool of unique subblocks and where the one or more subblocks are sufficient to recreate the members of the selected group of files identified by the file identification data;

adding a first derived data structure to the output file, where the first derived data structure includes one or more members of the first data structure; and adding a second derived data structure to the output file, where the second derived data structure includes one or more members of the second data structure;

where the output file contains sufficient data related to the files identified by the file identification data to facilitate a second computer different from the computer to recreate the files identified by the file identification data without accessing the selected group of files in their original format when the computer communicates the output file to the second computer.

* * * * *

UNITED STATES PATENT AND TRADEMARK OFFICE
CERTIFICATE OF CORRECTION

PATENT NO. : 8,595,195 B2
APPLICATION NO. : 12/246688
DATED : November 26, 2013
INVENTOR(S) : Roderick B. Wideman It is certified that error appears in the above-identified patent and that said Letters Patent is hereby corrected as shown below:

In the Claims:

In column 14, line 35, delete "subblock" and insert --subblocks--.

In column 15, lines 21-22, delete "method data." and insert --method.--.

Signed and Sealed this
Twelfth Day of August, 2014

Michelle K. Lee
*Deputy Director of the United States Patent and Trademark Office*